United States Patent
Gao et al.

(10) Patent No.: US 11,363,726 B2
(45) Date of Patent: Jun. 14, 2022

(54) CIRCUIT BOARD WITH AN EMBEDDED AN ELECTRONIC COMPONENT AND METHOD FOR MANUFACTURING THE SAME

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Lin-Jie Gao, Shenzhen (CN); Yong-Chao Wei, Qinhuangdao (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 155 days.

(21) Appl. No.: 17/027,927

(22) Filed: Sep. 22, 2020

(65) Prior Publication Data
US 2022/0039266 A1 Feb. 3, 2022

(30) Foreign Application Priority Data
Jul. 28, 2020 (CN) .......................... 202010737725.4

(51) Int. Cl.
| H05K 1/16 | (2006.01) |
| H05K 3/46 | (2006.01) |
| H05K 1/11 | (2006.01) |
| H05K 1/18 | (2006.01) |
| H05K 3/30 | (2006.01) |

(52) U.S. Cl.
CPC ........... *H05K 3/4697* (2013.01); *H05K 1/112* (2013.01); *H05K 1/183* (2013.01); *H05K 3/30* (2013.01); *H05K 3/4614* (2013.01)

(58) Field of Classification Search
CPC ...... H05K 3/4697; H05K 3/30; H05K 3/4614; H05K 1/112; H05K 1/183
USPC .......................................................... 174/260
See application file for complete search history.

(56) References Cited

U.S. PATENT DOCUMENTS

| 2007/0256858 A1* | 11/2007 | Kariya | ............. H01L 23/49827 |
| | | | 257/E23.062 |
| 2009/0183899 A1* | 7/2009 | Ishida | ................... H05K 1/116 |
| | | | 174/260 |

\* cited by examiner

*Primary Examiner* — Andargie M Aychillhum
(74) *Attorney, Agent, or Firm* — ScienBiziP, P.C.

(57) ABSTRACT

A circuit board includes a multilayer wiring board including a first wiring board and a second wiring board. A receiving cavity penetrates the second wiring board and corresponds to at least one connecting pad of the first wiring board. The receiving cavity includes a receiving portion penetrating the second wiring board and a plurality of recessed portions. Each recessed portion penetrates the second wiring board and is recessed from an inner wall defining the receiving portion. A width of each recessed portion gradually increases from a surface of the second wiring board facing the first wiring board toward a surface of the second wiring board facing away from the first wiring board. An electronic component is received in the receiving cavity and electrically connected to the at least one connecting pad. An adhesive fills in a gap between the electronic component and the second wiring board.

14 Claims, 6 Drawing Sheets

CIRCUIT BOARD WITH AN EMBEDDED AN ELECTRONIC COMPONENT AND METHOD FOR MANUFACTURING THE SAME

FIELD

The subject matter herein generally relates to a circuit, especially relates to a circuit board with an embedded electronic component and a method for manufacturing the circuit board with the embedded electronic component.

BACKGROUND

With the development of the electronic products, sizes of the circuit boards are becoming smaller, which may result in more components being embedded in the circuit board. However, in a process of embedding the components in the circuit boards, the components may be easily damaged.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
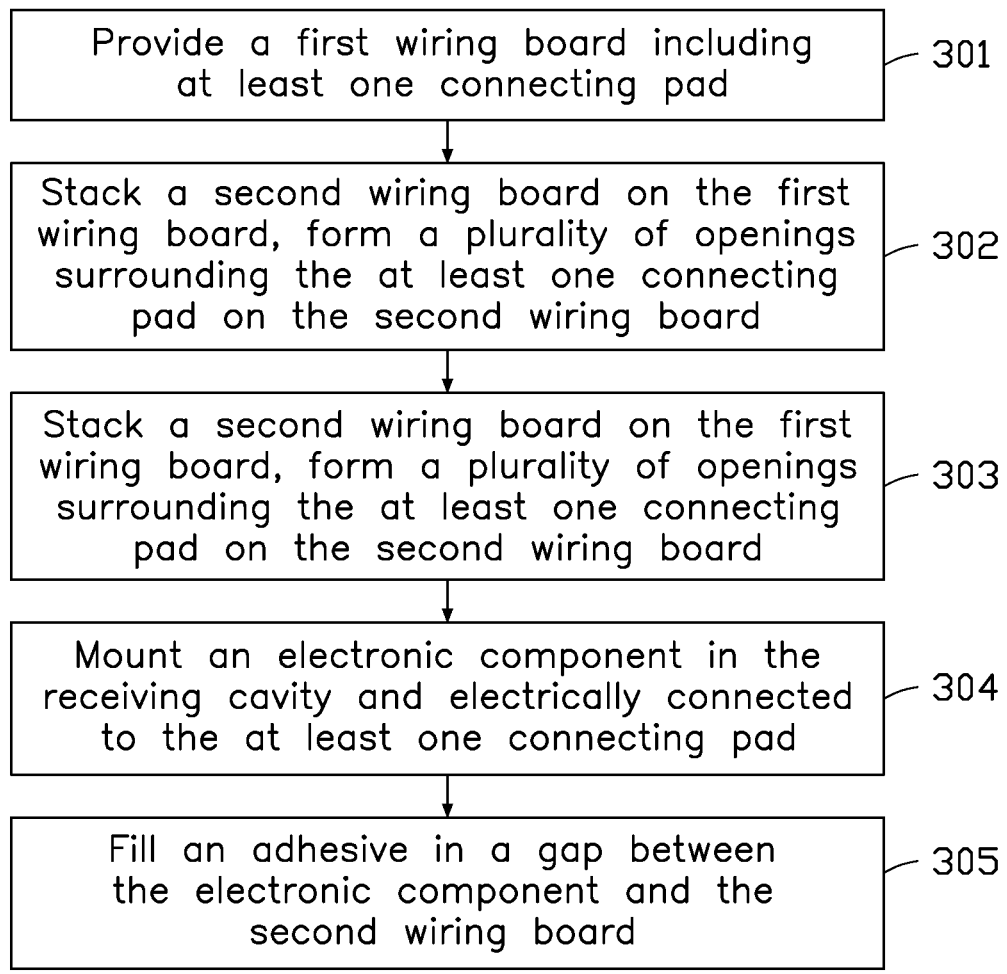
FIG. 1 is a flowchart of an embodiment of a method for manufacturing a circuit board with an embedded electronic component.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The embodiment for manufacturing a circuit board 100 (shown in FIG. 10) with an embedded electronic component is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 301.

Figure 2:
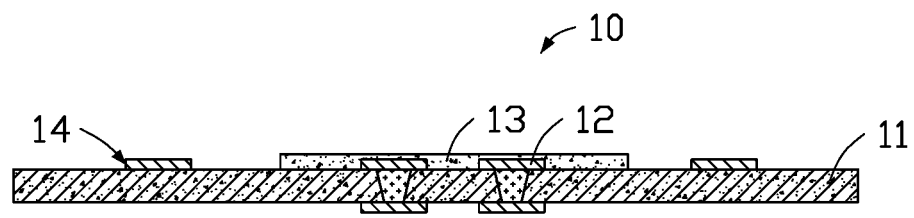
FIG. 2 is a cross-sectional view of an embodiment of a first wiring board.

At block 301, referring to FIG. 2, a first wiring board 10 is provided. The first wiring board 10 includes a first dielectric layer 11 and at least one first wiring layer 14.

The first wiring board 10 may be a flexible circuit board, a rigid circuit board or a flexible-rigid circuit board.

The first dielectric layer 11 may be made of polyimide (PI), glass-epoxy resin, polyethylene terephthalate (PET), polyethylene naphthalate (PEN), or polyethylene.

The first wiring board 10 may be include one first wiring layer 14 on a side of the first dielectric layer 11, two first wiring layers 14 on opposite sides of the first dielectric layer 11, or more than two first wiring layers 14. In at least one embodiment, when the number of the first wiring layers 14 is more than two, at least one first wiring layer 14 is wrapped by the first dielectric layer 11. In this embodiment, two first wiring layers 14 on opposite sides of the first dielectric layer 11.

The at least one first wiring layer 14 includes at least one connecting pad 12 on a side of the first dielectric layer 11 for connecting to electronic components.

In at least one embodiment, a protective film 13 may be formed on the side of first dielectric layer 11 with the connecting pad 12. The protective film 13 covers the connecting pad 12 to prevent the connecting pad 12 from being contaminated or damaged.

Figure 3:
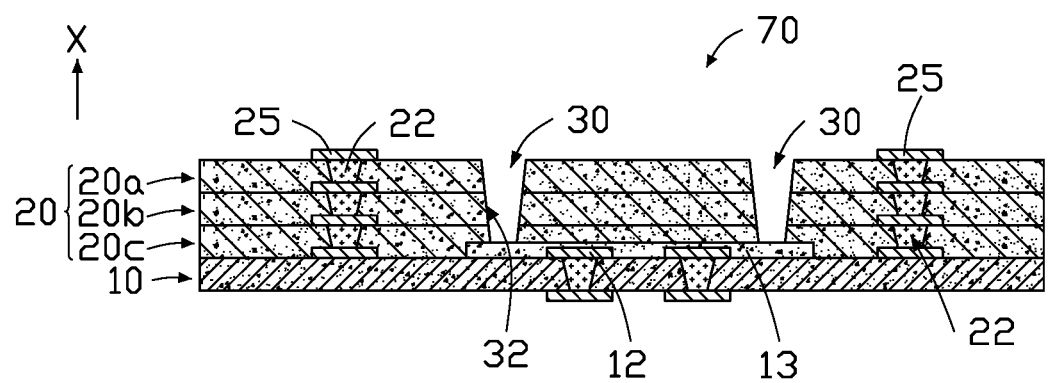
FIG. 3 is a cross-sectional view showing a second wiring board with a plurality of openings on the first wiring board of FIG. 2.
Figure 4:
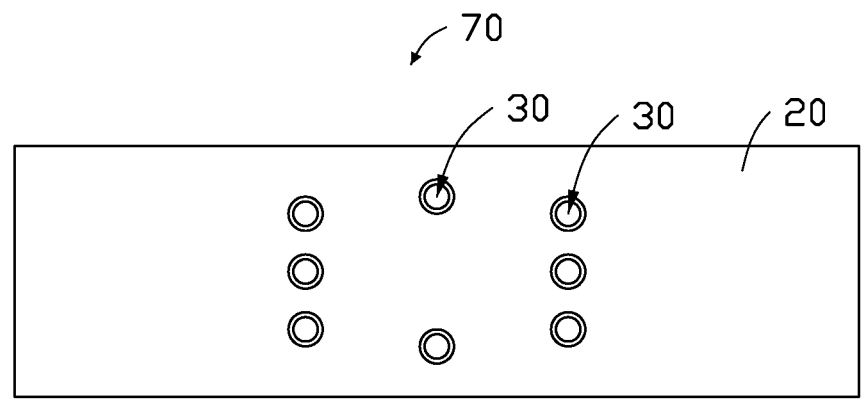
FIG. 4 is a top view of the second wiring board of FIG. 3.

At block 302, referring to FIGS. 3 and 4, a second wiring board 20 is stacked on the side of the first wiring board 10 with the connecting pad 12 along a first direction X, thereby obtaining a multilayer wiring board 70. A plurality of openings 30 surrounding the at least one connecting pad 12 is defined on the second wiring board 20, and each opening 30 penetrates the second wiring board 20 along the first direction. A width of each opening 30 gradually increases from a surface of the second wiring board 20 facing the first wiring board 10 toward a surface of the second wiring board 20 facing away from the first wiring board 10.

A side wall 32 surrounds to form one of the plurality of openings 30. The side wall 32 may be inclined or stepped to facilitate subsequent filling of an adhesive 60 (shown in FIG. 10), thereby reducing a risk of instability of an electronic element 50 (shown in FIG. 8) caused by insufficient filling of the adhesive 60.

The plurality of openings 30 are arranged in a ring shape, such as a circular ring shape or a square ring shape.

In at least one embodiment, the plurality of openings 30 are arranged in a square ring. The square ring includes four corners and four sides. Each of the corners corresponds to one of the plurality of openings 30. At least one of the plurality of openings 30 is arranged along each of the sides.

The second wiring board 20 may be a flexible circuit board, a rigid circuit board or a flexible-rigid circuit board.

Figure 5:
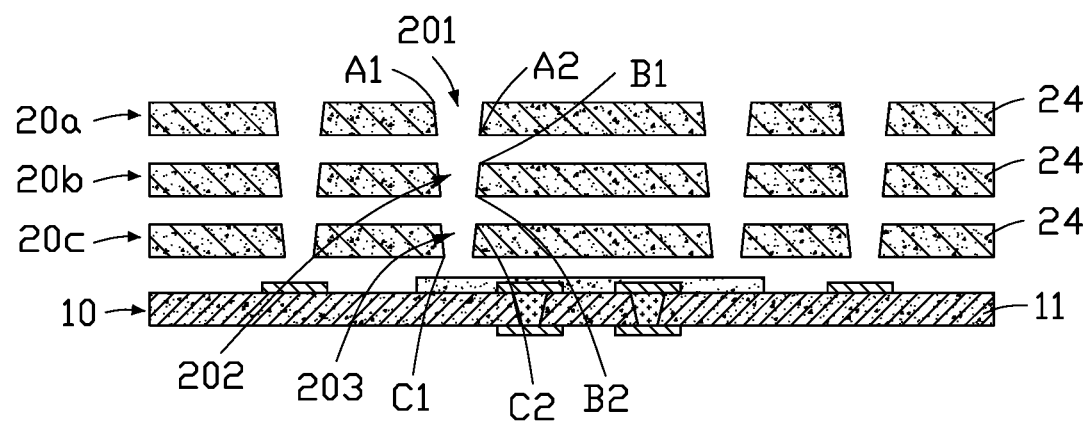
FIG. 5 is an exploded view of the second wiring board of FIG. 3.

The second wiring board 20 may include one sub-wiring board or a plurality of sub-wiring boards. In this embodiment, referring to FIGS. 5 and 3, the second wiring board 20 includes a first sub-wiring board 20a, a second sub-wiring board 20b, and a third sub-wiring board 20c stacked orderly. A plurality of first holes 201 arranged in a ring shape is defined on the first sub-wiring board 20a, and each first hole 201 penetrates the first sub-wiring board 20a. A plurality of second holes 202 is defined on the second sub-wiring board 20b. Each second hole 202 penetrates the second sub-wiring board 20b and corresponds to one of the plurality of first holes 201. A plurality of third holes 203 is defined on the third sub-wiring board 20c. Each third hole 203 penetrates the third sub-wiring board 20c and corresponds to one of the plurality of second holes 202. Each second hole 202 communicates with the corresponding first hole 201 and the corresponding third hole 203 to form one of the plurality of opening 30.

A periphery of an orthographic projection of an end B1 of each second hole 202 away from the third sub-wiring board 20c on the first wiring board 10 in the first direction is located within a periphery of an orthographic projection of an end A1 of the corresponding first hole 201 away from the second sub-wiring board 20b on the first wiring board 10 in the first direction. No part of the periphery of the orthographic projection of the end B1 overlaps with the periphery of the orthographic projection of the end A1. A periphery of an orthographic projection of an end C1 of each third hole 203 adjacent to the second sub-wiring board 20b on the first wiring board 10 in the first direction is located within the periphery of the orthographic projection of the end B1 of the corresponding second hole 202 on the first wiring board 10 in the first direction. No part of the periphery of the orthographic projection of the end C1 overlaps with the periphery of the orthographic projection of the end B1.

The orthographic projection of the end B1 of each second hole 202 on the first wiring board 10 in the first direction is located within an orthographic projection of the end A2 of the corresponding first hole 201 adjacent to the second sub-wiring board 20b on the first wiring board 10 in the first direction. The orthographic projection of the end C1 of each third hole 203 on the first wiring board 10 in the first direction is located within an orthographic projection of an end B2 of the corresponding second hole 202 adjacent to the third sub-wiring board 20c on the first wiring board 10 in the first direction. The orthographic projection of the end B2 of each second hole 202 on the first wiring board 10 in the first direction is located within the orthographic projection of the end B1 of the corresponding second hole 202 on the first wiring board 10 in the first direction. An orthographic projection of an end C2 of each third hole 203 away from the second sub-wiring board 20b on the first wiring board 10 in the first direction is located within the orthographic projection of the end C1 of the corresponding third hole 203 on the first wiring board 10 in the first direction.

In this embodiment, a width of each first hole 201 gradually increases from a side of the first sub-wiring board 20a facing the second sub-wiring board 20b toward a side of the first sub-wiring board 20a facing away from the second sub-wiring board 20b. A width of each second hole 202 gradually increases from a side of the second sub-wiring board 20b facing the third sub-wiring board 20c toward a side of the second sub-wiring board 20b facing away from the third sub-wiring board 20c. A width of each third hole 203 gradually increases from a side of the third sub-wiring board 20c facing away from the second sub-wiring board 20b toward a side of the third sub-wiring board 20c facing the second sub-wiring board 20b.

At least one conductive via 22 penetrates the second wiring board 20 to be electrically connected to the first sub-wiring board 20a, the second sub-wiring board 20b, and the third sub-wiring board 20c. The conductive via 22 includes a through hole and a conductive structure in the through hole. The through hole and the holes forming the openings 30 may be formed at the same time.

In at least one embodiment, the second wiring board 20 includes a second dielectric layer 24 and at least one second wiring layer 25. The at least one wiring layer 25 may include at least one exposed connecting pad.

The second dielectric layer 24 may be made of a material selected from a group consisting of polyimide, glass fiber epoxy resin, polyethylene terephthalate, and polyethylene naphthalate, polyethylene, and any combination thereof.

Figure 6:
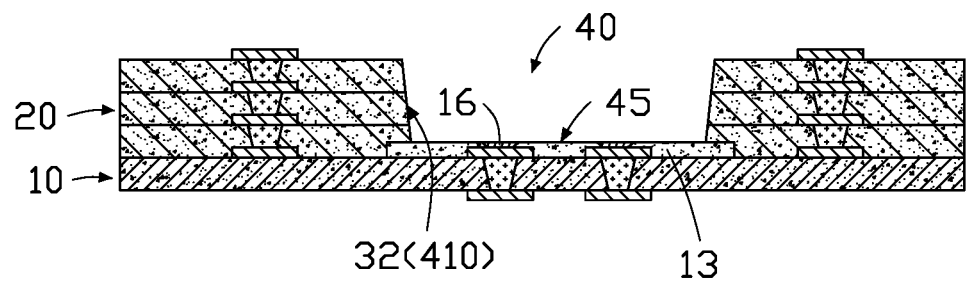
FIG. 6 is a cross-sectional view showing a receiving cavity on the second wiring board of FIG. 3.
Figure 7:
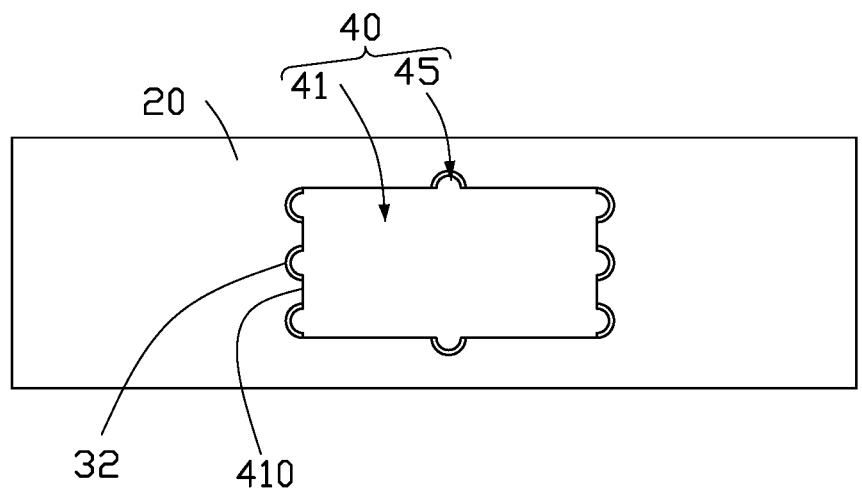
FIG. 7 is a top view of an embodiment of the second wiring board with the receiving cavity of FIG. 6.

At block 303, referring to FIGS. 6 and 7, a receiving cavity 40 corresponding to the at least one connecting pad 12 is formed by removing a region surrounded by the plurality of openings 30, and the at least one connecting pad 12 is exposed from the receiving cavity 40. The receiving cavity 40 includes a receiving portion 41 and a plurality of recessed portions 45. An inner wall 410 surrounds to define the receiving portion 41, and each of the plurality of recessed portions 45 is recessed from the inner wall 410. Each of the plurality of recessed portions 45 is a remaining part of one of the plurality of openings 30 when the receiving cavity 40 is formed.

In at least one embodiment, a width of the receiving portion 41 may be gradually increases from a surface of the second wiring board 20 facing the first wiring board 10 toward a surface of the second wiring board 20 facing away from the first wiring board 10.

In at least one embodiment, a portion of the protective film 13 is exposed from the receiving cavity 40.

In at least one embodiment, a conductive via 16 corresponding to each of the at least one connecting pad 12 is formed to penetrate the protective film 13. Each conductive via 16 electrically connects one of the at least one connecting pad 12.

In at least one embodiment, the conductive via 16 may be obtained by forming a through hole corresponding one of the at least one connecting pad 12 to penetrate the protective film 13 along the first direction X, and forming conductive materials in the through hole.

Figure 8:
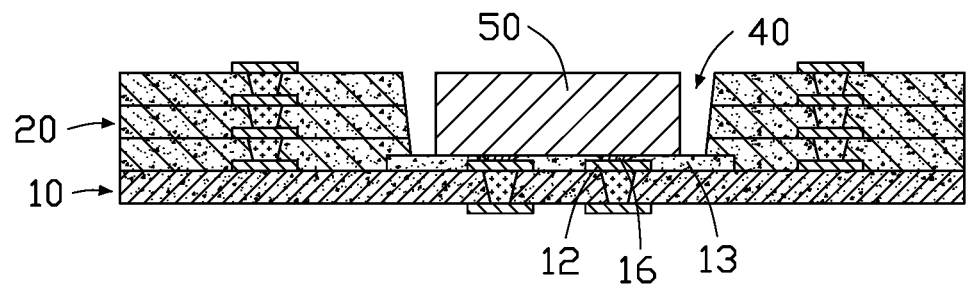
FIG. 8 is a cross-sectional view showing an electronic component in the receiving cavity of FIG. 6.
Figure 9:
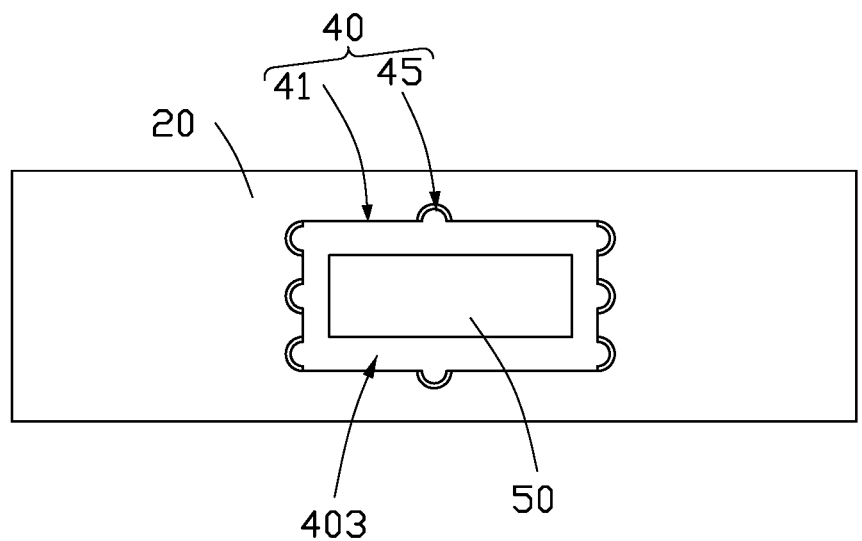
FIG. 9 is a top view of an embodiment of the second wiring board with electronic component of FIG. 8.

At block 304, referring to FIGS. 8 and 9, an electronic component 50 is mounted in the receiving cavity 40 and electrically connected to the at least one connecting pad 12. The electronic component 50 is spaced from the second wiring board 20.

In at least one embodiment, the electronic component 50 is received in the receiving portion 41 and spaced from the inner wall 410 of the receiving portion 41.

Figure 10:
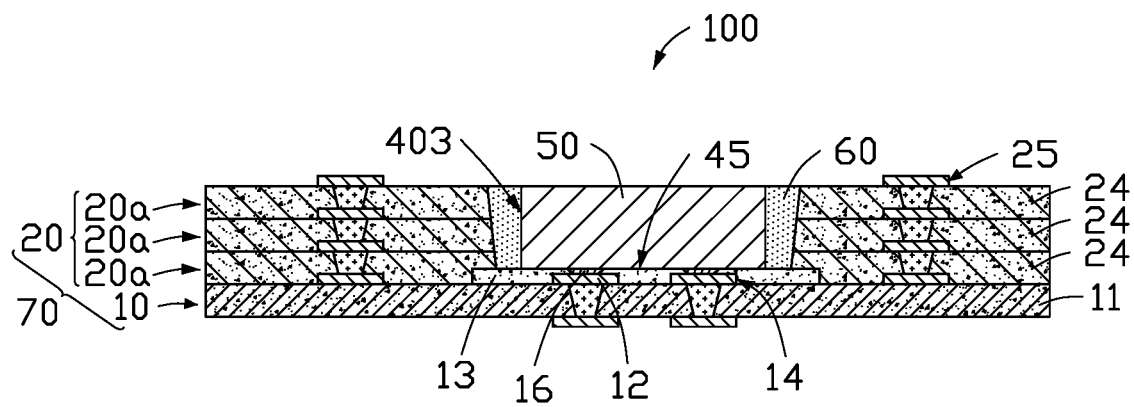
FIG. 10 is a cross-sectional view of an embodiment of a circuit board with an embedded electronic component.
Figure 11:
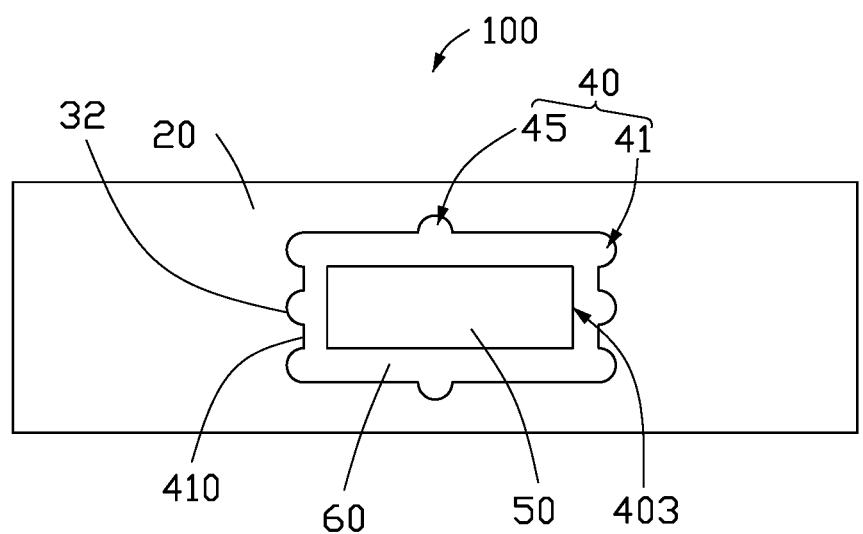
FIG. 11 is a top view of an embodiment of a circuit board with an embedded electronic component.

At block 305, referring to FIGS. 10 and 11, an adhesive 60 is filled in a gap 403 between the electronic component 50 and the second wiring board 20, thereby obtaining the circuit board 100. The electronic component 50 is embedded in the second wiring board 20.

In at least one embodiment, the adhesive 60 may be a thermal conductivity glue material, which is beneficial to conduct heat generated by the electronic component 50.

In at least one embodiment, the adhesive 60 may include a major component and fillers dispersed in the major component. The major component may be selected from a group consisting of polyimide, glass fiber epoxy resin, polyethylene terephthalate, and polyethylene naphthalate, polyethylene, and any combination thereof. The filler may be a composite material of boron nitride coated with silicon dioxide. The boron nitride is beneficial to improve a thermal conductivity of the adhesive 60. The silicon dioxide is beneficial to prevent the boron nitride from being broken and reduced.

In at least one embodiment, the fillers may have a mass percentage of 20% in the adhesive 60. The boron nitride may have a mass percentage of 5% in the fillers.

In at least one embodiment, the major component may be the same as a material of the first dielectric layer 11 or/and be the same as a material of the second dielectric layer 24, thereby reducing a difference in expansion coefficient between the first dielectric layer 11 and the adhesive 60, or/and reducing a difference in expansion coefficient between the second dielectric layer 24 and the adhesive 60.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 10 illustrates an embodiment of a circuit board 100 with an embedded electronic component. The circuit board 100 includes a multilayer wiring board 70, an electronic component 50 and an adhesive 60.

The multilayer wiring board 70 includes a first wiring board 10 and a second wiring board 20 stacked on a side of the first wiring board 10 along a first direction X.

The first wiring board 10 includes a first dielectric layer 11 and a first wiring layer 14 on a side of the first dielectric layer 11. The first wiring layer 14 includes at least one connecting pad 12.

Referring to FIG. 11, the circuit board 100 further includes a receiving cavity 40 penetrating the second wiring board 20 and corresponding to the at least one connecting pad 12. The receiving cavity 40 includes a receiving portion 41 penetrating the second wiring board 20 and a plurality of recessed portions 45. Each of the plurality of recessed portions 45 penetrates the second wiring board 20. An inner wall 410 surrounds to define the receiving portion 41, and each of the plurality of recessed portions 45 is recessed from the inner wall 410.

In at least one embodiment, an inner surface surrounding to define each of the plurality of recessed portions 45 may be inclined or stepped. A width of each of the plurality of recessed portions 45 gradually increases from a surface of the second wiring board 20 facing the first wiring board 10 toward a surface of the second wiring board 20 facing away from the first wiring board 10.

In at least one embodiment, a width of the receiving portion 41 may be gradually increases from a surface of the second wiring board 20 facing the first wiring board 10 toward a surface of the second wiring board 20 facing away from the first wiring board 10.

The electronic component 50 is mounted in the receiving cavity 40 and electrically connected to the at least one connecting pad 12. The electronic component 50 is spaced from the second wiring board 20. The adhesive 60 fills in a gap 403 between the electronic component 50 and the second wiring board 20. The plurality of recessed portions 45 may reduce a risk of collision between the electronic component 50 and the the second wiring board 20, and may increase a heat diffusion area of a periphery of the electronic component 50.

In at least one embodiment, the circuit board 100 may further include a protective film 13 formed on the side of the first wiring board 10 facing the second wiring board 20 and covering the at least one connecting pad 12. A conductive via 16 corresponding to each of the at least one connecting pad 12 penetrates the protective film 13 to be electrically connected to the corresponding connecting pad 12 and the electronic component 50.

In at least one embodiment, the adhesive 60 may be a thermal conductivity glue material, which is beneficial to conduct heat generated by the electronic component 50.

In at least one embodiment, the adhesive 60 may include a major component and fillers dispersed in the major component. The major component may be selected from a group consisting of polyimide, glass fiber epoxy resin, polyethylene terephthalate, and polyethylene naphthalate, polyethylene, and any combination thereof. The filler may be a composite material of boron nitride coated with silicon dioxide. The boron nitride is beneficial to improve a thermal conductivity of the adhesive 60. The silicon dioxide is beneficial to prevent the boron nitride from being broken and reduced.

In at least one embodiment, the fillers may have a mass percentage of 20% in the adhesive 60. The boron nitride may have a mass percentage of 5% in the fillers.

The second wiring board 20 includes a second dielectric layer 24 and at least one second wiring layer 25.

In at least one embodiment, the major component may be the same as a material of the first dielectric layer 11 or/and be the same as a material of the second dielectric layer 24, thereby reducing a difference in expansion coefficient between the first dielectric layer 11 and the adhesive 60, or/and reducing a difference in expansion coefficient between the second dielectric layer 24 and the adhesive 60.

In the method of for manufacturing a circuit board 100, the width of each opening 30 gradually increases from a surface of the second wiring board 20 facing the first wiring board 10 toward a surface of the second wiring board 20 facing away from the first wiring board 10, it is advantageous to fill the adhesive 60 in the subsequent process, avoid bumps when the electronic component 50 is installed, and increase a heat diffusion area of a periphery of the electronic component 50.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising: providing a multilayer wiring board comprising a first wiring board and a second wiring board stacked on the first wiring board along a first direction, wherein the first wiring board comprises at least one connecting pad, the multilayer wiring board comprises a plurality of openings surrounding the at least one connecting pad, each of the plurality of openings penetrates the second wiring board along the first direction, and a width of each of the plurality of openings gradually increases from a surface of the second wiring board facing the first wiring board toward a surface of the second wiring board facing away from the first wiring board; forming a receiving cavity corresponding to the at least one connecting pad by removing a region surrounded by the plurality of openings, wherein the receiving cavity comprise a receiving portion and a plurality of recessed portions, an inner wall surrounds to define the receiving portion, each of the plurality of recessed portions is recessed from the inner wall, and is a remaining part of one of the plurality of openings; mounting an electronic component in the receiving cavity, wherein the electronic component is electrically connected to the at least one connecting pad and spaced from the second wiring board; and filling an adhesive in a gap between the electronic component and the second wiring board, thereby obtaining the circuit board, wherein a method for manufacturing the multilayer wiring board comprises: providing a first wiring board comprising at least one connecting pad; providing a first sub-wiring board, a second sub-wiring board and a third sub-wiring board, wherein a plurality of first holes arranged in a ring shape is formed on the first sub-wiring board, each of the plurality of first holes penetrates opposite sides of the first sub-wiring board; a plurality of second holes arranged in a ring shape is formed on the second sub-wiring board, each of the plurality of second holes penetrates opposite sides of the second sub-wiring board; a plurality of third holes arranged in a ring shape is formed on the third sub-wiring board, each of the plurality of second holes penetrates opposite sides of the third sub-wiring board; stacking the first sub-wiring board, the second sub-wiring board, the third sub-wiring board, and the first wiring board orderly along a first direction and pressing the first wiring board, the first sub-wiring board, the second sub-wiring board and the third sub-wiring board together to obtaining the multilayer wiring board, wherein each of the plurality of second holes communicates one of the plurality of first holes and one of the plurality of third holes to obtain an opening, a plurality of openings surrounds the at least one connecting pad, and a width of each of the plurality of openings gradually increases from a surface of the second wiring board facing the first wiring board toward a surface of the second wiring board facing away from the first wiring board.

2. The method of claim 1, wherein a width of each of the plurality of first holes gradually increases from a side of the first sub-wiring board facing the second sub-wiring board toward a side of the first sub-wiring board facing away from the second sub-wiring board; a width of each of the plurality of second holes gradually increases from a side of the second sub-wiring board facing the third sub-wiring board toward a side of the second sub-wiring board facing away the third sub-wiring board; a width of each of the plurality of third holes gradually increases from a side of the third sub-wiring board facing away the second sub-wiring board toward a side of the third sub-wiring board facing the second sub-wiring board.

3. The method of claim 1, wherein before stacking the first sub-wiring board, the second sub-wiring board, the third sub-wiring board, and the first wiring board orderly along a first direction, the method for manufacturing the multilayer wiring board further comprises forming a protective film on the first wiring board to cover the at least one connecting pad; before mounting an electronic component in the receiving cavity, the method for manufacturing the circuit board further comprise forming a conductive via penetrating the protective film to electrically connects the at least one connecting pad.

4. The method of claim 1, wherein at least one conductive via penetrates the second wiring board to be electrically connected to the first sub-wiring board, the second sub-wiring board, and the third sub-wiring board.

5. The method of claim 1, wherein each of the plurality of openings is formed by surrounding a side wall, the side wall is inclined or stepped.

6. The method of claim 1, wherein a width of the receiving portion is gradually increases from the surface of the second wiring board facing the first wiring board toward the surface of the second wiring board facing away from the first wiring board.

7. The method of claim 1, wherein the adhesive is a thermal conductivity glue material.

8. The method of claim 7, wherein the adhesive comprises a major component and fillers dispersed in the major component, the major component is selected from a group consisting of polyimide, glass fiber epoxy resin, polyethylene terephthalate, and polyethylene naphthalate, polyethylene, and any combination thereof; each of the fillers is a composite material of boron nitride coated with silicon dioxide.

9. The method of claim 8, wherein the fillers have a mass percentage of 20% in the adhesive, the boron nitride has a mass percentage of 5% in the fillers.

10. A circuit board with an embedded electronic component comprising: a multilayer wiring board comprising a first wiring board and a second wiring board stacked on the first wiring board along a first direction; an electronic component embedded in the multilayer wiring board; and an adhesive; wherein the first wiring board comprises at least one connecting pad, a receiving cavity penetrates the second wiring board and corresponds to the at least one connecting pad, the receiving cavity comprises a receiving portion penetrating the second wiring board and a plurality of recessed portions arranged in a ring shape; an inner wall surrounds to define the receiving portion, each of the plurality of recessed portions penetrates the second wiring board and is recessed from the inner wall; a width of each of the plurality of recessed portions gradually increases from a surface of the second wiring board facing the first wiring board toward a surface of the second wiring board facing away from the first wiring board; the electronic component is received in the receiving cavity and electrically connected to the at least one connecting pad; the adhesive fills in a gap between the electronic component and the second wiring board, wherein a width of the receiving portion is gradually increases from the surface of the second wiring board facing the first wiring board toward the surface of the second wiring board facing away from the first wiring board.

11. The circuit board with the embedded electronic component of claim 10, wherein each of the plurality of recessed portions is formed by a side wall, the side wall is inclined or stepped.

12. The circuit board with the embedded electronic component of claim 10, wherein the adhesive is a thermal conductivity glue material.

13. The circuit board with the embedded electronic component of claim 12, wherein the adhesive comprises a major component and fillers dispersed in the major component, the major component is selected from a group consisting of polyimide, glass fiber epoxy resin, polyethylene terephthalate, and polyethylene naphthalate, polyethylene, and any combination thereof; each of the fillers is a composite material of boron nitride coated with silicon dioxide.

14. The circuit board with the embedded electronic component of claim 13, wherein the fillers have a mass percentage of 20% in the adhesive, the boron nitride has a mass percentage of 5% in the fillers.

* * * * *